US010236420B2

(12) United States Patent
Shan et al.

(10) Patent No.: US 10,236,420 B2
(45) Date of Patent: Mar. 19, 2019

(54) COLOR TUNABLE LED ASSEMBLY

(71) Applicant: Luminus, Inc., Sunnyvale, CA (US)

(72) Inventors: Qifeng Shan, Santa Clara, CA (US); Tao Tong, Fremont, CA (US); Daniel Than, Sunnyvale, CA (US)

(73) Assignee: Luminus, Inc., Sunnyvale, CA (US)

( * ) Notice: Subject to any disclaimer, the term of this patent is extended or adjusted under 35 U.S.C. 154(b) by 331 days.

(21) Appl. No.: 15/284,520

(22) Filed: Oct. 3, 2016

(65) Prior Publication Data

US 2018/0094799 A1     Apr. 5, 2018

(51) Int. Cl.
| H01L 33/50 | (2010.01) |
| H01L 33/48 | (2010.01) |
| H05B 33/08 | (2006.01) |
| H01L 33/62 | (2010.01) |

(52) U.S. Cl.
CPC ............ *H01L 33/50* (2013.01); *H01L 33/486* (2013.01); *H01L 33/62* (2013.01); *H05B 33/086* (2013.01)

(58) Field of Classification Search
CPC ....... H01L 33/50; H01L 33/486; H01L 33/62; H01L 33/64; H05B 33/086; F21V 23/004; F21V 9/30; F21V 23/003; F21V 23/005; F21V 29/503; F21V 29/85; F21V 29/86; F21Y 2115/10
See application file for complete search history.

(56) References Cited

U.S. PATENT DOCUMENTS

| 2012/0187430 A1* | 7/2012 | West | H01L 25/0753 |
| | | | 257/88 |
| 2012/0286301 A1* | 11/2012 | Kobayakawa | H01L 29/866 |
| | | | 257/88 |
| 2013/0119417 A1* | 5/2013 | Andrews | H01L 33/60 |
| | | | 257/91 |
| 2015/0243863 A1 | 8/2015 | Shi et al. | |
| 2017/0130909 A1* | 5/2017 | Yeon | H01L 33/50 |

OTHER PUBLICATIONS

Introduction to Rayben's PCB Technologies, Rayben Technologies Ltd., Report No. LLS-TR-2014-004A, 19 pages (Mar. 2014).
Product Data Sheet for CUBE 1616—Mid-Power LED, Fujian Lightning Optoelectronic Co. Ltd, 24 pages (May 2016).

* cited by examiner

*Primary Examiner* — Bao Q Truong
(74) *Attorney, Agent, or Firm* — Wolf, Greenfield & Sacks, P.C.

(57) ABSTRACT

An LED assembly includes two strings of surface mounted LED devices mounted to a central ceramic plug portion of a PCB substrate. One string has a CCT of 4000 degrees Kelvin. The other has a CCT of 1800 degrees Kelvin. For each LED device in one string there is a corresponding LED device in the other string. The LED devices of each pair are closely spaced with 0.2-0.6 mm between them. A Highly Reflective (HR) layer is disposed on the substrate between the LED devices. The HR layer has a thickness in a range of from 20 to 50 percent H, where H is the height of an LED die. A transparent silicone layer covers the LED devices. A resistor of a warm-dimming circuit is mounted over the ceramic portion of the substrate whereas an integrated circuit portion of the circuit is mounted over the PCB portion of the substrate.

7 Claims, 5 Drawing Sheets

TOP-DOWN DIAGRAM OF LED ASSEMBLY

CROSS-SECTIONAL SIDE VIEW OF LED ASSEMBLY

LEADFRAME OVERMOLDED WITH EPOXY MATERIAL

LED DICE ARE ATTACHED TO OVERMOLDED LEADFRAME

OVERMOLD WITH SILICONE AND SECTION INTO LED CUBE DEVICES

PERSPECTIVE VIEW OF A TOP
CORNER OF ONE LED CUBE DEVICE

PERSPECTIVE VIEW OF A BOTTOM
CORNER OF ONE LED CUBE DEVICE

WARM-DIMMING COLOR TUNING CIRCUIT

LIGHT OUTPUT OF ONE LED DEVICE ON A SUBSTRATE
AS A FUNCTION OF THE HR LEVEL

CLOSER SPACING - HIGHER LEVEL OF HR

FARTHER SPACING

LOWER LEVEL OF HR

COLOR TUNABLE LED ASSEMBLY

TECHNICAL FIELD

The described embodiments relate to Light Emitting Diode (LED) assemblies.

SUMMARY

A Light Emitting Diode (LED) assembly includes a substrate, a first plurality of surface mounted LED devices, a second plurality of surface mounted LED devices, a Highly Reflective (HR) layer, a transparent layer, and a warm-dimming color tuning circuit. The substrate comprises a central ceramic plug portion, a printed circuit board portion that surrounds the central ceramic portion in a lateral dimension, and a plurality of metal conductors that extend laterally from the printed circuit board portion and over at least a portion of the central ceramic plug portion. All the metal conductors that extend over the central ceramic portion are in the same one metal interconnect layer and there is one and only one metal interconnect layer of the substrate that extends over the central ceramic plug portion. The first plurality of surface mounted LED devices emit light of a first CCT (for example, a Correlated Color Temperature (CCT) of 4000 degrees Kelvin) and are mounted over the central ceramic plug portion of the substrate in a first string. The second plurality of surface mounted LED devices emits light of a second CCT (for example, a CCT of 1800 degrees Kelvin) and are mounted over the central ceramic plug portion of the substrate in a second string. Each individual LED device in the first string has a corresponding LED device in the second string. Each individual LED device in the first string is mounted with a spacing (S) of between 0.2 millimeters and 0.6 millimeters from its corresponding LED device in the second string. The LED devices of each pair area mounted closely together at less than 0.6 millimeters so that the light emitted will appear as a single point source with a single CCT as opposed to a first point source of a first CCT and a second point source of a second CCT. The LED devices of each pair are, however, slightly spaced to accommodate patterning of conductors of the one and only one metal interconnect layer that extends over the ceramic portion of the substrate. The HR layer is placed to cover the substrate between the LED devices of the first and second strings. The HR layer includes reflective particles (for example, $TiO_2$ particles) that render the HR layer highly reflective. Of importance, the HR layer has a thickness that is in a range of from 20 percent of H to 50 percent of H, where H is the height of one of the LED dice. The HR layer is microjetted or dispensed onto the substrate and to this thickness. The transparent layer is encircled in the lateral dimension by a circular confinement dam. The transparent layer is disposed over the HR layer and extends over and entirely covers all the LED devices of the first and second strings. The transparent layer is substantially transparent to light emitted from the LED devices and it comprises substantially no phosphor particles. Because the transparent layer is transparent and does not include phosphor particles, it does not generate heat due to wavelength-converting light from the underlying LED dice. Due to the surface mounting of the LED devices on the substrate, the one and only one metal interconnect layer between the LED devices and the ceramic portion of the substrate, and the very heat conductive ceramic portion of the substrate, heat from the LED devices tends to pass downward through the heat conductive ceramic portion of the substrate as opposed to passing upward into the transparent layer.

During operation of the LED assembly, as the overall current flowing through the first and second strings decreases, the warm-dimming color tuning circuit causes the second string to emit proportionally more light as a proportion of the total light emitted by the first and second strings. Accordingly, as the overall amount of light emitted by the LED assembly decreases, the CCT of the overall LED assembly shifts from about 3000 degrees Kelvin at full power to about 1800 degrees Kelvin at low power. In one example, the warm-dimming color tuning circuit includes a discrete surface mount resistor component and an integrated circuit component. The discrete resistor component is surface mounted over the ceramic portion of the substrate. The integrated circuit component is surface mounted over the PCB portion of the substrate.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "upper", "top", "up", "down", "laterally" and "bottom" are used herein to describe relative orientations between different parts of the structure being described, and it is to be understood that the overall structure being described can actually be oriented in any way in three-dimensional space.

Figure 1:
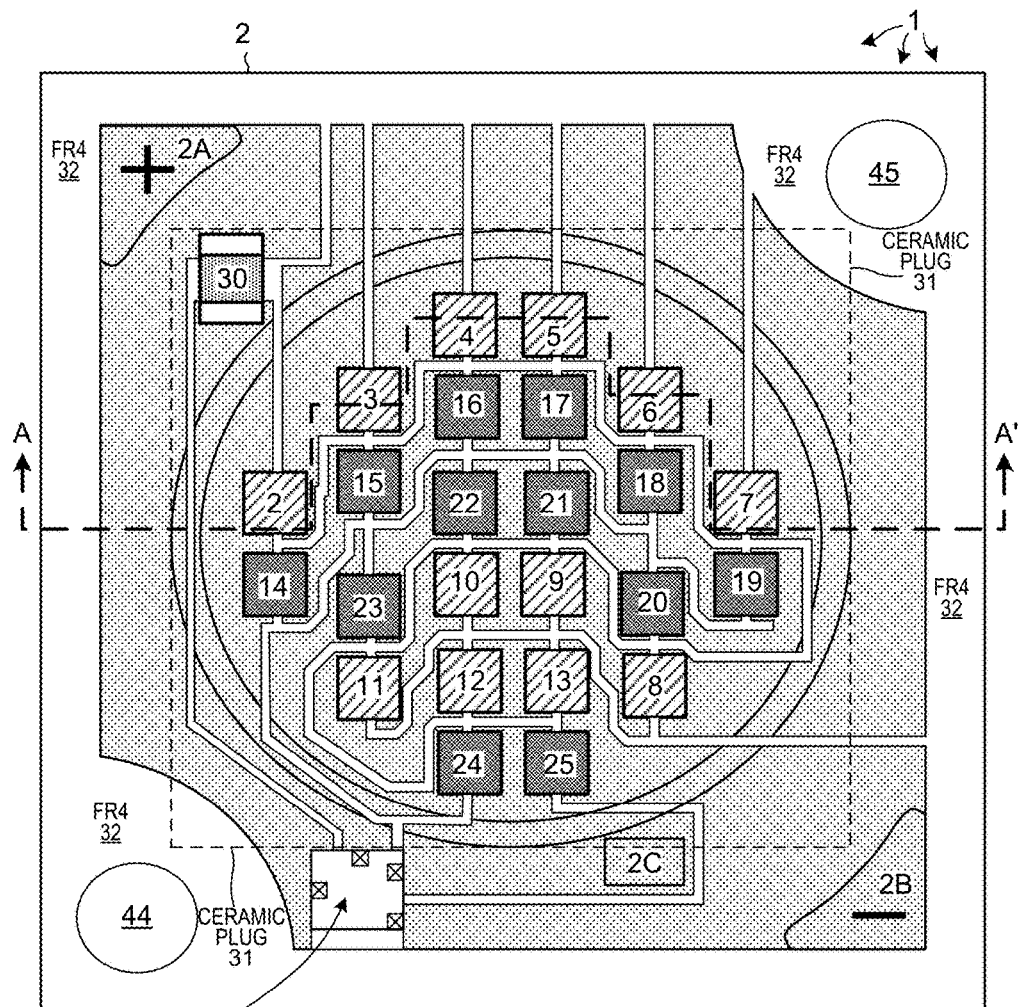
FIG. 1 is a top-down diagram of an LED assembly in accordance with one novel aspect.

FIG. 1 is a top-down diagram of a Light Emitter Diode (LED) assembly 1 in accordance with one novel aspect. Assembly 1 includes a substrate 2, a first plurality of surface mounted LED devices 2-13 coupled together in a first string, a second plurality of surface mounted LED devices 14-25 coupled together in a second string, a first layer of silicone 26 that includes reflective particles (for example, titanium dioxide ($TiO_2$) particles) so it is referred to as a Highly Reflective (HR) layer, a second layer of silicone 27 that is transparent and has substantially no phosphor particles in it, a circular silicone confinement dam 28, a warm-dimming color tuning surface mount integrated circuit 29, and a discrete surface mount resistor component 30.

Figure 2:
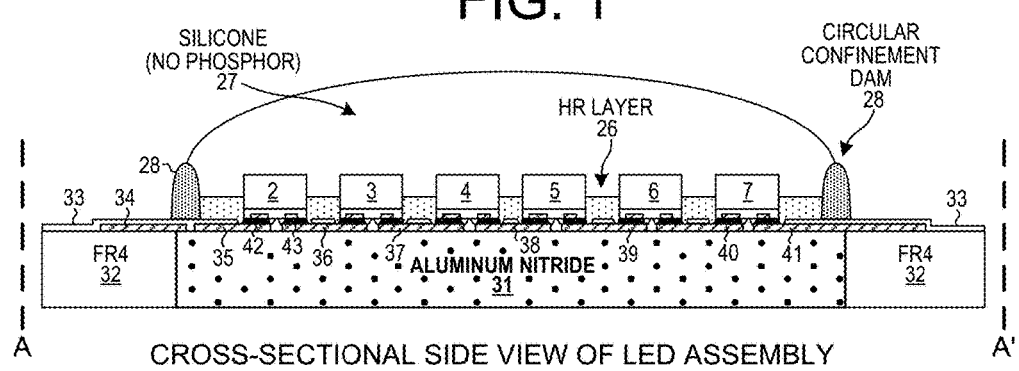
FIG. 2 is a cross-sectional diagram taken along sectional line A-A' of FIG. 1.

FIG. 2 is a cross-sectional diagram taken along sectional line A-A' of FIG. 1. As shown in FIG. 2, substrate 2 comprises a central ceramic plug portion 31, a Printed Circuit Board (PCB) portion 32 that surrounds the central ceramic portion in a lateral dimension, and a plurality of metal conductors that extend laterally from the PCB portion and over at least a portion of the central ceramic plug portion, and a solder mask layer 33. The solder mask layer 33 is not shown in FIG. 1. In the present example, the ceramic of the central ceramic portion 31 is aluminum nitride. The ceramic portion 31, from the top-down perspective, has a square shape as indicated by the square dashed line 31 in FIG. 1. The PCB portion 32 is a multilayer FR4 flame retardant glass-reinforced epoxy liminate sheet PCB. All the different conductors of substrate 2 are not identified with separate reference numerals in the illustration of FIG. 1 because there would be too many reference numerals and the drawing would become cluttered. The multiple metal interconnect layers within the PCB portion 32, except for the conductors 34 and 41 of the top metal conductor layer, are not shown in FIG. 2.

The particular metal conductors that appear in the cross-section of FIG. 2 are identified by reference numerals 34-41. All the metal conductors that extend over the central ceramic portion 31 are in the same one metal interconnect layer. Of importance, there is one and only one metal interconnect layer of the substrate that extends over the central ceramic plug portion. An amount of solder that is coupled to a conductor of this metal interconnect layer is not considered to be another metal interconnect layer. Similarly, a plating layer of a conductor of this metal interconnect layer is considered to be part of the overall metal interconnect layer and is not considered to be another metal interconnect layer. None of the LED devices is disposed on a metal conductor of a metal interconnect layer that is separated from the ceramic portion 31 by an intervening dielectric layer, such as by a dielectric layer that separates and is disposed between two metal interconnect layers of a multi-layer metal interconnect structure. To the contrary, each of the LED dice of the assembly 1 is attached to underlying metal conductors by amounts of solder, and these metal conductors are in direct contact with ceramic of the central ceramic portion 31. Reference numerals 42 and 43 identify two such amounts of solder. The portion 2A of the substrate at the upper left of the top-down diagram of FIG. 1 is an exposed "+" contact pad for solder attachment. The portion 2B of the substrate at the lower right of the top-down diagram of FIG. 1 is an exposed "−" contact pad for solder attachment. There is also an exposed contact pad 2C that is coupled to a node in the second string of LED devices at the anode of LED device 24 and the cathode of LED device 25. These metal pads are "exposed" in the sense that they are not covered by solder mask. There are holes 44 and 45 in the lower left area and the upper right corner area of the substrate. These holes accommodate screws or bolts used to attach the assembly 1 to another object such as to a heatsink.

Figure 3A:
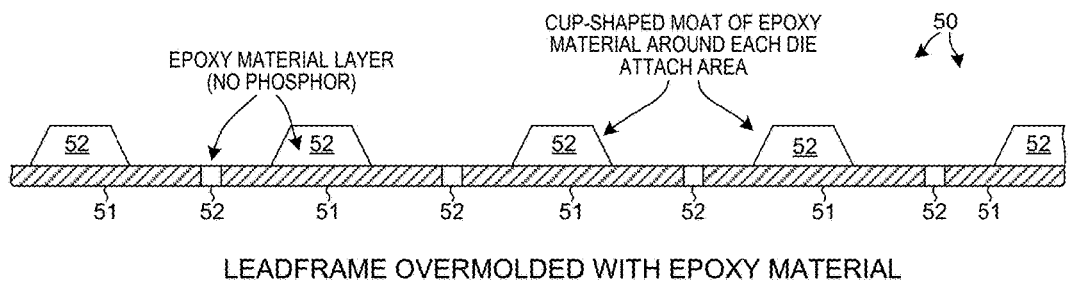
FIG. 3A is a cross-sectional diagram of a leadframe overmolded with an epoxy layer.
Figure 3B:
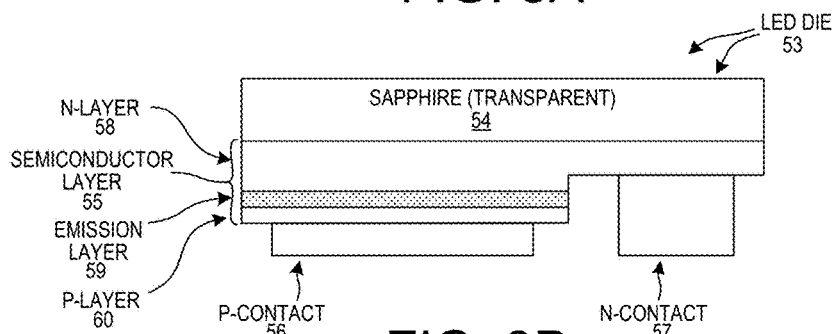
FIG. 3B is a cross-sectional diagram of an LED die of the type incorporated into an LED device of the LED assembly of FIG. 1.
Figure 3C:
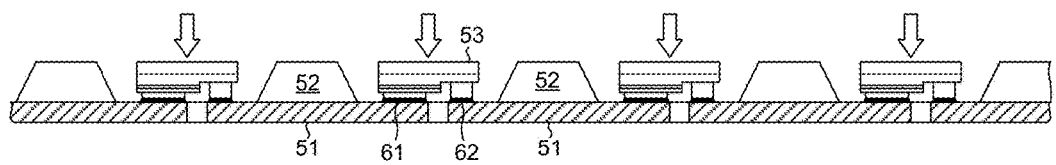
FIG. 3C is a cross-sectional diagram that shows how LED dice of the type shown in FIG. 3B are attached to the overmolded leadframe of FIG. 3A.
Figure 3D:
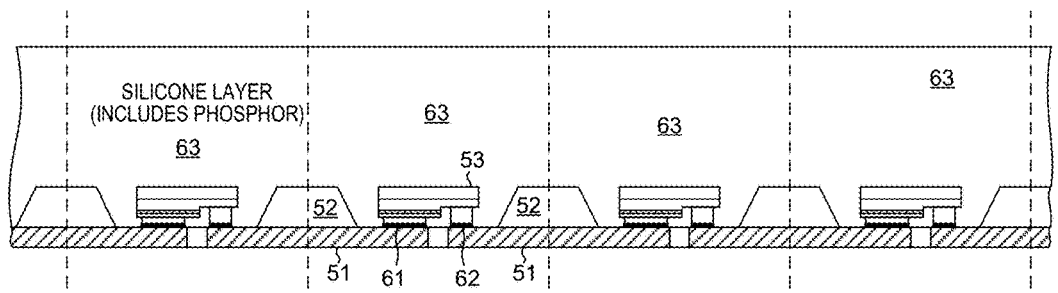
FIG. 3D is a cross-sectional diagram that shows the assembly of FIG. 3C, after it has been overmolded with a layer of silicone.
Figure 4:
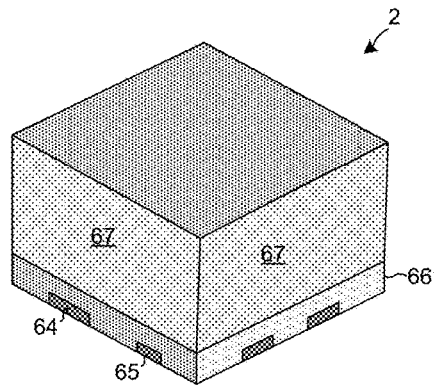
FIG. 4 is a perspective view of a top corner of one of the cube-shaped surface mounted LED devices of the LED assembly of FIG. 1.
Figure 5:
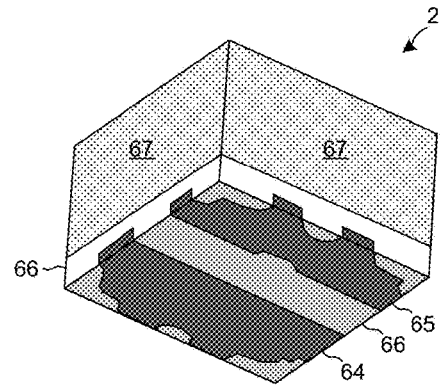
FIG. 5 is a perspective view of a bottom corner of the cube-shaped surface mounted LED device of FIG. 4.

FIGS. 3A, 3B, 3C and 3D illustrate steps in the manufacture of the LED device 2 illustrated in FIG. 4 and FIG. 5. All the LED devices 2-25 are of identical construction, except that the phosphor material of the LED devices 2-13 is different from the phosphor material of the LED devices 14-25. The LED devices 2-13 emit light having a Color Correlated Temperature (CCT) of 4000 degrees Kelvin. This light of a relatively higher CCT is referred to here as "cooler" light. The LED devices 14-25 light having a CCT of 1800 degrees Kelvin. This light of a relatively lower CCT is referred to here as "warmer" light.

FIG. 3A is a cross-sectional diagram of a leadframe panel 50. Leadframe panel 50 includes a stamped metal plate leadframe 51, and a first structure 52 of epoxy material. The epoxy material is a relatively hard material that the transfer molded onto the metal leadframe 51 to form a two-dimensional array of cup-shaped moats. Each such cup-shaped moat surrounds a die attach area of the metal leadframe. Each die attach area has a substantially rectangular shape when considered from the top-down perspective.

FIG. 3B is a simplified cross-sectional diagram of a laterally-contacted flip-chip LED die 53. Die 53 is sometimes called a "blue" LED. It emits non-monochromatic light having a wavelength in a range from approximately 440 nanometers to approximately 500 nanometers. Die 53 includes a transparent sapphire substrate portion 54, a semiconductor layer 55, a P-contact 56 of metal, and an N-contact 57 of metal. The semiconductor layer 55 involves an N-type GaN layer 58, a light-emitting active layer 59, and a P-type GaN layer 60, as shown.

FIG. 3C is a simplified cross-sectional diagram that illustrates how flip-chip LED dice of the type illustrated in FIG. 3B are attached to leadframe panel 50. One flip-chip LED die is attached in each die attach area as illustrated. Flip-chip LED die 53, for example, is attached by amounts 61 and 62 of solder to the leadframe 51.

FIG. 3D is a simplified cross-sectional diagram that illustrates how the structure of FIG. 3C is overmolded with an overmold structure 63 of thermoset resin-based silicone. This overmold structure and layer 63 of silicone is different from the epoxy layer 52 in that the silicone layer 63 includes phosphor particles. In the case of the LED devices of the first string, the phosphor particles are of a first type that absorbs light from the blue LED dice and in turn causes the overall LED devices to emit cooler light having a higher CCT of 4000 degrees Kelvin. In the case of the LED devices of the second string, the phosphor particles are of a second type that absorbs light from the blue LED dice and in turn causes the overall LED devices to emit warmer light having a lower CCT of 1800 degrees Kelvin. Even though the layer 63 of silicone includes phosphor particles, it is nonetheless referred to here simply as a silicone layer. After overmolding with the layer 63 of silicone, the overmolded panel is sectioned into individual cube-shaped surface mount LED devices. The vertical dashed lines in FIG. 3D indicate where the panel is cut.

FIG. 4 is a perspective view of a top corner of one of the cube-shaped surface mount LED devices. LED device 2 is the device that includes the flip-chip LED die 53 pictured in FIG. 3D. This is also the same cube-shaped surface mount LED device 2 at the head of the first string of LED devices pictured in FIG. 1. Reference numerals 64 and 65 identify the leadframe portions of the LED device 2. The first metal leadframe portion 64 is in electrical contact with the P-contact 56 of the die 53 inside the LED device 2. The second metal leadframe portion 65 is in electrical contact with the N-contact 57 of the die 53 inside the LED device 2. Reference numeral 66 identifies an epoxy portion of the LED device 2. This epoxy portion 66 is a cut portion of the epoxy material layer 52 of the original panel of FIG. 3A. Reference numeral 67 identifies a silicone portion of the LED device 2. This silicone portion 67 is a cut portion of the silicone layer 63 of the overmolded panel illustrated in FIG. 3D.

FIG. 5 is a perspective view of a bottom corner of the cube-shaped surface mount LED device 2.

Figure 6:
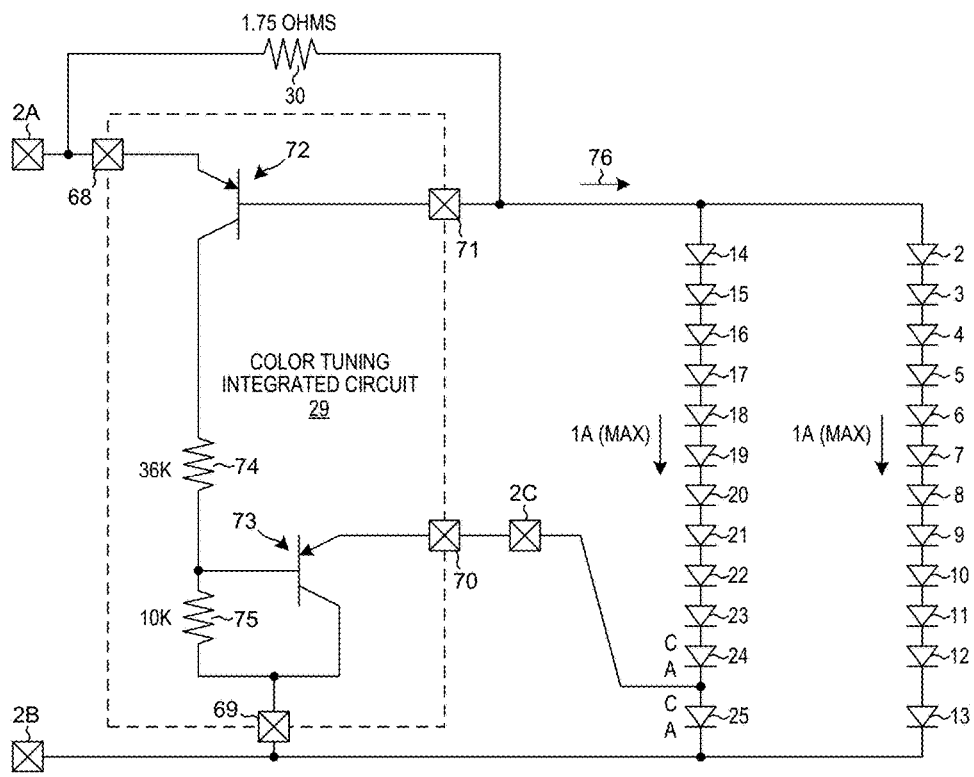
FIG. 6 is a circuit diagram of the circuitry of the LED assembly of FIG. 1.

FIG. 6 is a circuit diagram of the circuitry of the assembly 1. The circuitry includes the warm-dimming color tuning surface mount integrated circuit 29, the surface mount resistor 30, the first string of LED devices 2-13, and the second string of LED devices 14-25. Integrated circuit 29 is actually a packaged surface mount integrated circuit that includes a semiconductor device package and a semiconductor die disposed within the package. FIG. 6 is therefore a simplified diagram. Packaged surface mount integrated circuit 29 includes four package terminals 68-71, two bipolar transistors 72 and 73, and two resistors 74 and 75. Arrow 76 represents the overall current flowing through the first and second strings. If the overall current 76 is high at over 0.4 amperes, then the current flowing through resistor 30 causes the voltage drop across the base-to-emitter junction of transistor 72 to be greater than 0.7 volts. Transistor 72 is therefore on and conductive. Accordingly, there is current flow through resistors 74 and 75 to the ground terminal 69. The voltage on the base of transistor 73 is pulled up, so the voltage across the base-to-emitter junction of transistor 73 is less than 0.7 volts. Transistor 73 is therefore off. Because transistor 73 is off, it has no effect on the operation of second string of LED devices. There is an equal number of LED devices in each of the two strings, so both strings are on and share the overall current 76. As the overall current 76 drops to 0.4 amperes and below, the voltage drop across resistor 30 drops. When the voltage across resistor 30 falls below 0.7 volts, then the transistor 72 begins turning off. This cuts current flow through resistors 74 and 75, which in turn reduces the voltage on the base of transistor 73. Transistor 73 begins to turn on, and begins to pull the voltage on the anode of LED device 24 down to the potential on package terminal 69. There are then effectively eleven LED devices in the second string between the "+" terminal 2A and the "−" terminal 2B. At the lower level of the overall current 76, the voltage drop across the first string between the voltage on terminal 71 and the voltage on terminal 69 begins to decrease, so the LED devices in the first string see low forward voltages and begin to dim. The forward voltages across the LED devices of the second string, on the other hand, are larger due to the second string having one fewer LED device in series between the voltage on terminal 71 and the voltage at the anode of LED device 24 (this also is the voltage on package terminal 70, which is a voltage close to the voltage on package terminal 69 by virtue of transistor 73 being on). As a result, as the overall current 76 decreases, the LED devices 14-24 in the second string emit proportionally more light as a proportion of the total light emitted by the first and second strings. Because the LED devices of the second string emit so-called "warmer" light having a lower Color Correlated Temperature (CCT) of 1800 degrees Kelvin as compared to the LED devices of the first string that emit so-called "cooler" light having a higher CCT of 4000 degrees Kelvin, the overall light emitted by the assembly 1 is seen to "warm" as the overall amount of light is reduced. This is called "warm dimming". When the overall current 76 is at its maximum value of 2.0 amperes, the CCT of the assembly 1 is about 3000 degrees Kelvin due to color mixing between light emitted from both the first and second strings. When the overall current 76 is at its minimum, the CCT of the assembly 1 is about 1800 degrees Kelvin because the first string is emitting very little or no light. The description above of the operation of the circuit of FIG. 6 is somewhat simplified. For a more accurate understanding of the operation of the circuit, the circuit can be simulated using a circuit simulator program such as SPICE and/or the circuit can be manufactured and its actual operation measured and tested.

Figure 7:
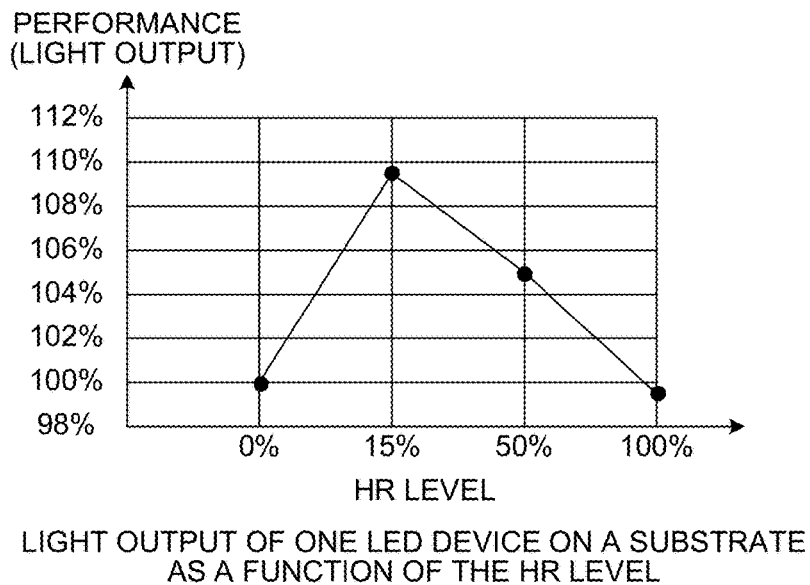
FIG. 7 is a chart that illustrates how the amount of light emitted from an assembly changes when the level of an HR silicone layer is increased.

FIG. 7 is a chart that illustrates how the amount of light emitted from an assembly changes when the level of an HR silicone layer is increased. In the chart, an HR level of zero percent indicates that there is no HR silicone layer covering the substrate. An HR level of one hundred percent indicates that the top of the HR silicone layer reaches the top of the LED device. An HR level of fifty percent indicates that the top of the HR silicone layer reaches a level that is halfway between the zero percent level and the one hundred percent level. The chart indicates that the optimal level of the HR silicone layer thickness is about fifteen percent. The data of FIG. 7 was determined by mounting a single LED device on a substrate, and then measuring the amount of light emitted from the overall structure for different HR silicone layer thicknesses. Measurements were taken for four different thicknesses.

From the data of FIG. 7, it might be concluded that the LED devices of a pair in an assembly such as the assembly of FIG. 1 should be placed as closely together as possible, and that the thickness of the HR silicone layer should be about fifteen percent of the height (H) of the LED devices. The inventors, however, have recognized that the LED devices of a pair in the assembly of FIG. 1 should not be placed as closely together as possible and that the LED devices of the pair should also not be separated from each other by too much. One and only one metal interconnect layer is to be present over and on the ceramic portion 31. In order to provide the geometry of conductors necessary to connect the LED device together in the two strings, and in order for the pairs of LED devices to have sufficiently uniform spacings, the LED devices of a pair should be separated from one another by at least 0.2 millimeters. In order for light emitted from the pair to appear as a single point source, and not to appear as discrete light point sources of different colors, the LED devices of the pair should not be separated from one another by more than about 0.6 millimeters. The midrange value of 0.4 millimeters is therefore the inter-LED device spacing (S). For this 0.4 millimeter spacing (S), the optimal HR layer thickness is determined not to be fifteen percent of the height (H) as might be concluded from the data of FIG. 7, but rather is a different thickness.

Figure 8:
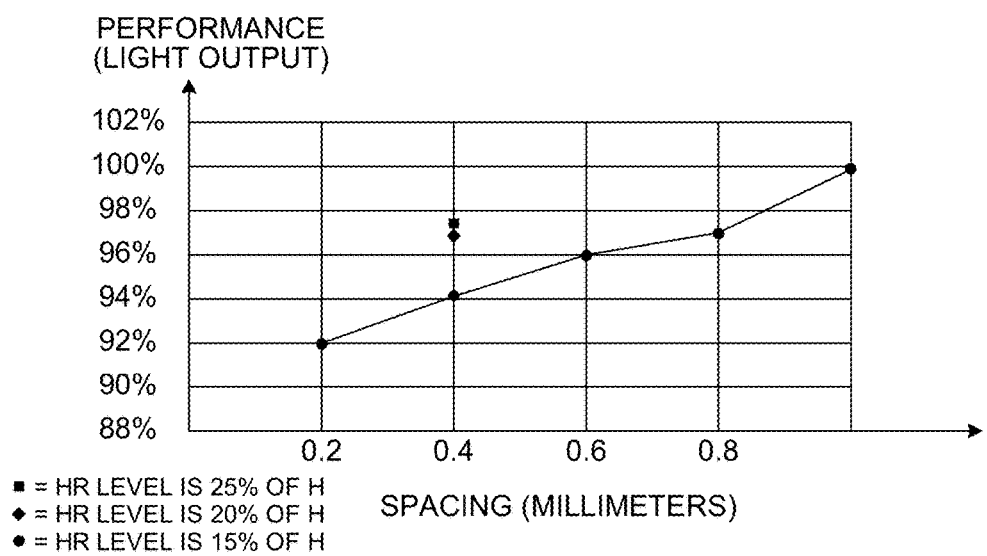
FIG. 8 is a chart that illustrates how the amount of light emitted from another assembly changes when the level of an HR silicone layer is changed.

FIG. 8 is a chart that illustrates results of experiments that were performed. An emitting LED device was mounted to a substrate, and was surrounded by four dummy LED devices. These dummy LED devices were of the same construction as the center emitting LED device, but were not powered. A first dummy device was located at a spacing to the top of the emitting LED device. A second dummy device was located at the same spacing from the emitting LED device, only it was located to the left of the emitting LED device. A third dummy device was located at the same spacing from the emitting LED device, but it was located to the right of the emitting LED device. A fourth dummy device was located at the same spacing, but it was located to the bottom of the emitting LED device. The four dummy LED devices were therefore located at the corners of a square, with the emitting LED device being located at the center of the square. At a spacing of 0.4 millimeters (between the emitted LED device and each of the dummy LED devices), the amount of light emitted by the overall assembly was measured. For a spacing of 0.4 millimeters, the experiment was conducted with an HR level of fifteen percent. This was determined, however, not to be the optimal HR level from a light output perspective because when the HR level was increased to twenty percent, the amount of light emitted from the overall device was seen to increase. When the HR level was increased further to twenty-five percent, the amount of light emitted from the overall device increased even further. In accordance with one novel aspect, the inter-LED device spacing between LED devices of each pair is between 0.2 and 0.6 millimeters, and the thickness of the HR silicone layer is in a range of from twenty percent of H to fifty percent of H, where the height H is the height of the LED device. The thickness of the solder is included in the height H, so the height H is the distance from the top surface of the substrate (the top surface of the metal conductors to which the LED device is soldered) to the top surface of the LED device itself.

Figure 9:
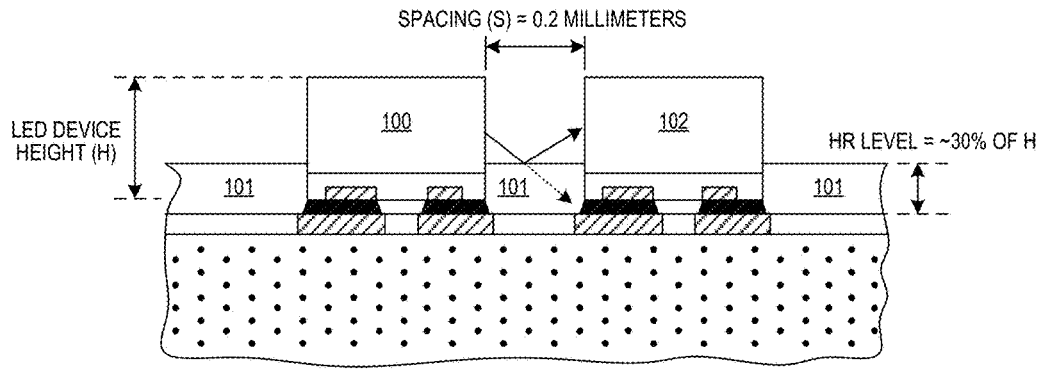
FIG. 9 illustrates how a light ray emitted from one LED device of a pair of LED devices may reflect off the upper surface of the HR silicone layer and then be incident on the side of the neighboring LED device of the pair.
Figure 10:
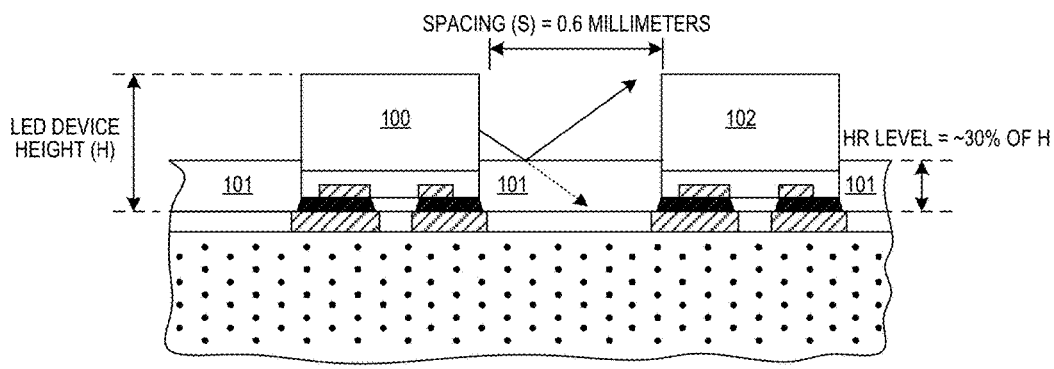
FIG. 10 illustrates a case of the two LED devices of a pair being more separated, and how with this wider separation a light ray emitted from one LED device of the pair may reflect off the upper surface of the HR silicone layer and clear the other LED device of the pair.
Figure 11:
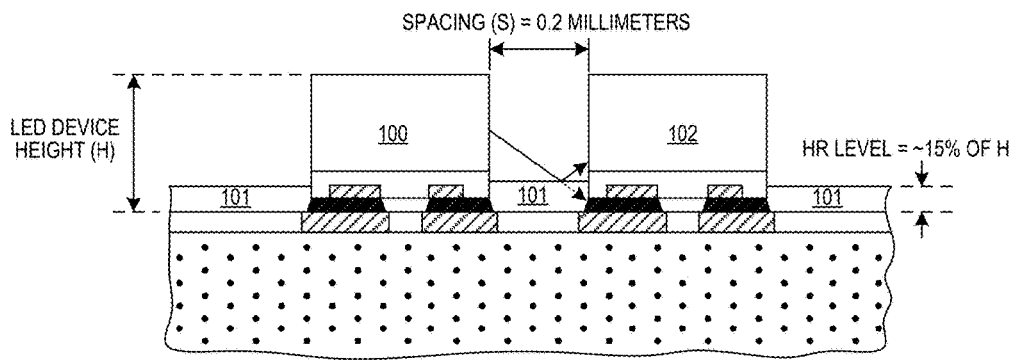
FIG. 11 illustrates a case of the HR layer being thinner, and how with this thinner HR layer a light ray emitted from one LED device of the pair may reflect off the upper surface of the HR silicone layer but then be absorbed by the neighboring LED device.

FIGS. 9, 10 and 11 illustrate possible reasons for the experimental observations. As shown in FIG. 9, a light ray emitted from one LED device 100 of the pair may reflect off the upper surface of the HR silicone layer 101 and yet still be incident on the side of the neighboring LED device 102. Such a light ray may tend to be absorbed by the neighboring LED device 102 such that the light is lost. If the light ray were to penetrate the HR silicone layer, on the other hand, then it may then be incident on a lower part of the neighboring LED device. Under this condition the light ray also may be absorbed by the neighboring LED device and effectively lost. Due to the relatively low level of the HR silicone layer, much of the right-facing sidewall of the emitting LED device 100 is exposed. This is good from a light emission standpoint, because light can be emitted from this larger unblocked portion of the sidewall. The relatively large and unblocked amount of the sidewalls of the LED devices is positive from the perspective of allowing more light to be emitted from an emitting LED device.

FIG. 10 illustrates two neighboring LED devices of a pair, but in the case of FIG. 10 the spacing between the LED devices 101 and 12 is greater as compared to the tighter spacing of FIG. 9. A similar light ray emitted from the leftmost LED device, that has the same point of emission and the same angle as in the example of FIG. 9, if it reflects off the upper surface of the HR silicone layer 101 may clear the second LED device 102 on the right. The amount of light emitted from the overall assembly in a condition with such larger spacings is believed to be greater as compared to the inter-LED device spacing illustrated in FIG. 9.

FIG. 11 illustrates two neighboring LED devices of a pair, but in the case of FIG. 11 the HR silicone layer thickness is smaller as compared to the thicker HR silicone layer in the case of FIG. 9. More of the absorbing sidewall of the LED device 102 to the right is exposed. A similar light ray emitted from the leftmost LED device 100, that has the same point of emission and the same angle as in the example of FIG. 9, will be incident on the sidewall of the rightmost device because the HR silicone layer 101 leaves so much of the sidewall of the rightmost device uncovered. Due to the lower HR silicone layer level, however, there will be more of the right-facing sidewall of the LED device 100 unblocked by HR silicone material so there is more sidewall that can emit light. The amount of light emitted from the overall assembly in a condition with this thinner HR silicone layer is believed to be smaller as compared to the inter-LED device spacing (S) and HR thickness illustrated in FIG. 9.

The tradeoff between the positive effect of having less of the sidewalls of the emitted LED devices blocked by reflective HR silicone layer material and the negative effect of having more of the absorbing sidewall of the neighboring LED device exposed due to a lower HR silicone layer is complex. The range of twenty percent H to fifty percent H is therefore empirically determined by experiment for the preferred 0.4 inter-LED device spacing (S) range.

Although an example is set forth above where the LED devices of the first and second strings have leadframe portions, in other examples the LED devices do not have leadframe portions. For example, each of the LED devices may be made by flip-chip mounting an LED die to a substrate, and then spray coating or overmolding the LED die with a phosphor-containing material. In the case of overmolding, the phosphor-containing material may be a temperature-cured resin-based silicone that contains phosphor particles. Regardless of how it is applied, the phosphor-containing material is made to cover all four sidewall of the die, and is also made to extend over and to cover the entire planar top surface of the die. The phosphor-containing material may be made to extend along the die sidewalls all the way down to the level of the substrate. The phosphor-containing material therefore forms a sort of cap-like covering over the LED die. After the phosphor-containing material has hardened, then the LED die along with its phosphor-containing cap-like covering is removed from the substrate. The LED die and its phosphor-containing cap-like covering are referred to together as an LED device. Some such LED devices are made with a first phosphor-containing material so that these LED devices emit light having the desired first CCT for the first string, whereas other such LED devices are made with a second phosphor-containing material so that these LED devices emit light having the desired second CCT for the second string.

In another example, each LED device comprises a blue LED die, an associated wavelength-converting platelet, and an amount of optically transparent adhesive. The platelet is attached to the top of the blue LED die (for example, to the top of sapphire 54 of FIG. 3B) by a thin five micron thick layer of the optically transparent adhesive (for example, silicone adhesive). In one example, the platelet is a thin (fifty to four hundred microns thick) piece of ceramic or glass into which wavelength-converting phosphor particles have been incorporated. The platelet has a square upper surface area when considered from the top-down perspective. The square surface area is roughly a match for the square top-down dimensions of the underlying LED die. The LED devices of the first string have platelets of a first type so that the blue light emitted by the dice is converted into light of the CCT of 4000 degrees Kelvin for the first string, and the LED devices of the second string have platelets of a second type so that the blue light emitted by the dice is converted into light of the CCT of 1800 degrees Kelvin for the second string.

Although an example is set forth above where each LED device includes one and only one LED die, in another example each LED device includes two lateral LED dice. The LED device has a first leadframe portion and a second leadframe portion. The first and second LED dice within the LED device are wirebonded such that they are coupled together in series. A current can flow into the LED device via the first leadframe portion, up into the first LED die via the P-contact of the first LED die, out of the first LED die via the N-contact of the first LED die, across a bond wire to the P-contact of the second LED die, and out of the second LED die via the N-contact of the second LED die, and then down and out of the LED device via the second leadframe portion.

Although certain specific embodiments are described above for instructional purposes, the teachings of this patent document have general applicability and are not limited to the specific embodiments described above. The two strings can include pairs of LED devices as described above where each of the two strings has the same number of LED devices, and can also include pairs of LED devices as described above where one of the strings has more LED devices than the other string. The two strings still have pairs of corresponding LED devices. The warm-dimming color tuning integrated circuit 29 and the resistor 30 may, in some examples, not be included in the assembly 1 and the two strings of LED devices are driven independently and separately by an external drive circuit (that is not a part of the assembly 1) that is coupled to the three terminals 2A, 2B and 2C. In such an example, resistor 30 may be replaced with a shorting piece of wire or a surface mount zero ohm resistor or another suitable conductive member. Accordingly, various modifications, adaptations, and combinations of various features of the described embodiments can be practiced without departing from the scope of the invention as set forth in the claims.

What is claimed is:

1. A Light-Emitting Diode (LED) assembly comprising:
a substrate comprising a central ceramic plug portion, a printed circuit board portion that surrounds the central ceramic portion in a lateral dimension, and a plurality of metal conductors that extend laterally from the printed circuit board portion and over at least a portion of the central ceramic plug portion, wherein all the metal conductors that extend over the central ceramic portion are in the same one metal interconnect layer and there is one and only one metal interconnect layer of the substrate that extends over the central ceramic plug portion;
a first plurality of surface mounted LED devices, wherein each LED device of the first plurality emits light of a first CCT, wherein the LED devices of the first plurality of surface mounted LED devices are mounted over the central ceramic plug portion of the substrate in a first string;
a second plurality of surface mounted LED devices, wherein each LED device of the second plurality emits light of a second CCT, wherein the LED devices of the second plurality of surface mounted LED devices are mounted over the central ceramic plug portion of the substrate in a second string, wherein each individual LED device in the first string has a corresponding LED device in the second string, and wherein said each individual LED device in the first string is mounted with a spacing (S) of between 0.2 millimeters and 0.6 millimeters from its corresponding LED device in the second string;
a first layer of silicone that is disposed on the substrate between the LED devices of the first and second strings, wherein the first layer of silicone includes reflective particles that render the first layer of silicone highly reflective, wherein one of the LED devices of the first string has a height H, and wherein the first layer has a thickness that is in a range of from twenty percent to fifty percent of the height H;
a second layer of silicone that is disposed over the first layer of silicone and over the LED devices of the first and second strings, wherein the second layer of silicone comprises substantially no phosphor particles and entirely covers all the LED devices of the first and second strings; and
a warm-dimming color tuning circuit, wherein as an overall current flowing through the first and second strings decreases the warm-dimming color tuning circuit causes the second string to emit proportionally more light as a proportion of the total light emitted by the first and second strings, wherein at least part of the warm-dimming color tuning circuit is disposed on the printed circuit board portion of the substrate assembly.

2. The LED assembly of claim 1, wherein the warm-dimming color tuning circuit includes a discrete resistor component and an integrated circuit, wherein the discrete resistor component is mounted over the central ceramic portion of the substrate, and wherein the integrated circuit is mounted over the printed circuit board portion of the substrate.

3. The LED assembly of claim 1, wherein each surface mounted LED device of the first plurality of surface mounted LED devices comprises a pair of metal leadframe portions, a LED die disposed on the leadframe portions, and a block of material that covers the LED die and that includes a wavelength-converting material.

4. The LED assembly of claim 1, wherein each surface mounted LED device of the first plurality of surface mounted LED devices comprises a pair of metal leadframe portions, a pair of LED dice, and a block of material that covers the pair of LED dice and that includes a wavelength-converting material.

5. The LED assembly of claim 1, wherein each surface mounted LED device of the first plurality of surface mounted LED devices comprises an LED die, a wavelength-converting platelet, and an amount of adhesive that attaches the wavelength-converting platelet to the LED die.

6. The LED assembly of claim 1, wherein said one of the LED devices of the first string has a terminal, wherein the terminal has a planar bottom surface that is soldered to a metal conductor of the substrate, wherein said one of the LED devices of the first string also has a third surface, wherein the third surface is a planar top surface of the LED device, and wherein the height H of said one of the LED devices of the first string is a distance along a line normal to the planar bottom surface from the planar bottom surface up to the planar top surface.

7. The LED assembly of claim 1, wherein the second layer of silicone is substantially transparent to the light emitted by the first plurality of surface mounted LED devices and that is also substantially transparent to the light emitted by the second plurality of surface mounted LED devices.

\* \* \* \* \*